(12) United States Patent
Contopanagos et al.

(10) Patent No.: US 6,937,128 B2
(45) Date of Patent: Aug. 30, 2005

(54) ON-CHIP INDUCTOR HAVING A SQUARE GEOMETRY AND HIGH Q FACTOR AND METHOD OF MANUFACTURE THEREOF

(75) Inventors: Harry Contopanagos, Santa Monica, CA (US); Sissy Kyriazidou, Santa Monica, CA (US)

(73) Assignee: Broadcom Corp., Irvine, CA (US)

( * ) Notice: Subject to any disclaimer, the term of this patent is extended or adjusted under 35 U.S.C. 154(b) by 0 days.

(21) Appl. No.: 10/074,158

(22) Filed: Feb. 12, 2002

(65) Prior Publication Data

US 2003/0162376 A1 Aug. 28, 2003

(51) Int. Cl.[7] ............................................... H01F 5/00
(52) U.S. Cl. ..................... 336/200; 336/232; 336/223
(58) Field of Search ................................ 336/223, 232, 336/200; 29/602.1, 606

(56) References Cited

U.S. PATENT DOCUMENTS 6,285,273 B1 * 9/2001 Morikawa .................. 336/200
6,407,647 B1 * 6/2002 Apel et al. ................... 333/25
2003/0137383 A1 * 7/2003 Yang et al.

OTHER PUBLICATIONS

Danesh, "A Q–Factor enhancement technique fo MMIC inductors", IEEE MTT–S Digest, pp. 183–186, Jun. 1998.

* cited by examiner

*Primary Examiner*—Anh Mai
(74) *Attorney, Agent, or Firm*—Garlick, Harrison & Markison, LLP; Timothy W. Markison

(57) ABSTRACT

An on-chip inductor and/or on-chip transformer includes at least one dielectric layer and at least one conductive winding on the at least one dielectric layer. The conductive winding has a substantially square geometry and has at least its exterior corners geometrically shaped to reduce impedance of the conductive winding at a particular operating frequency. Since the quality factor of an on-chip inductor is inversely proportional to the effective series impedance of an inductor at an operating frequency, by reducing the effective series impedance, the quality factor is increased.

15 Claims, 5 Drawing Sheets

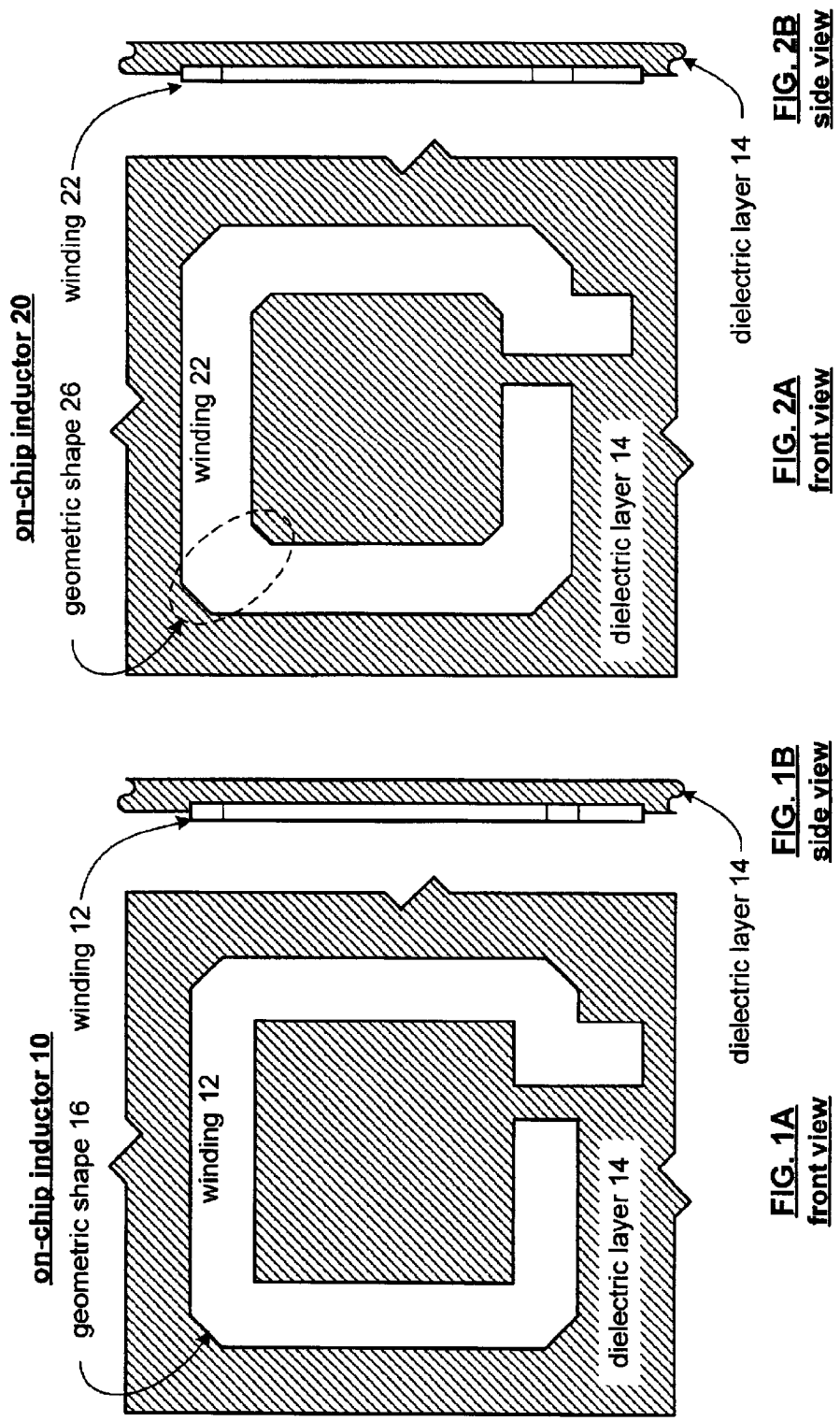

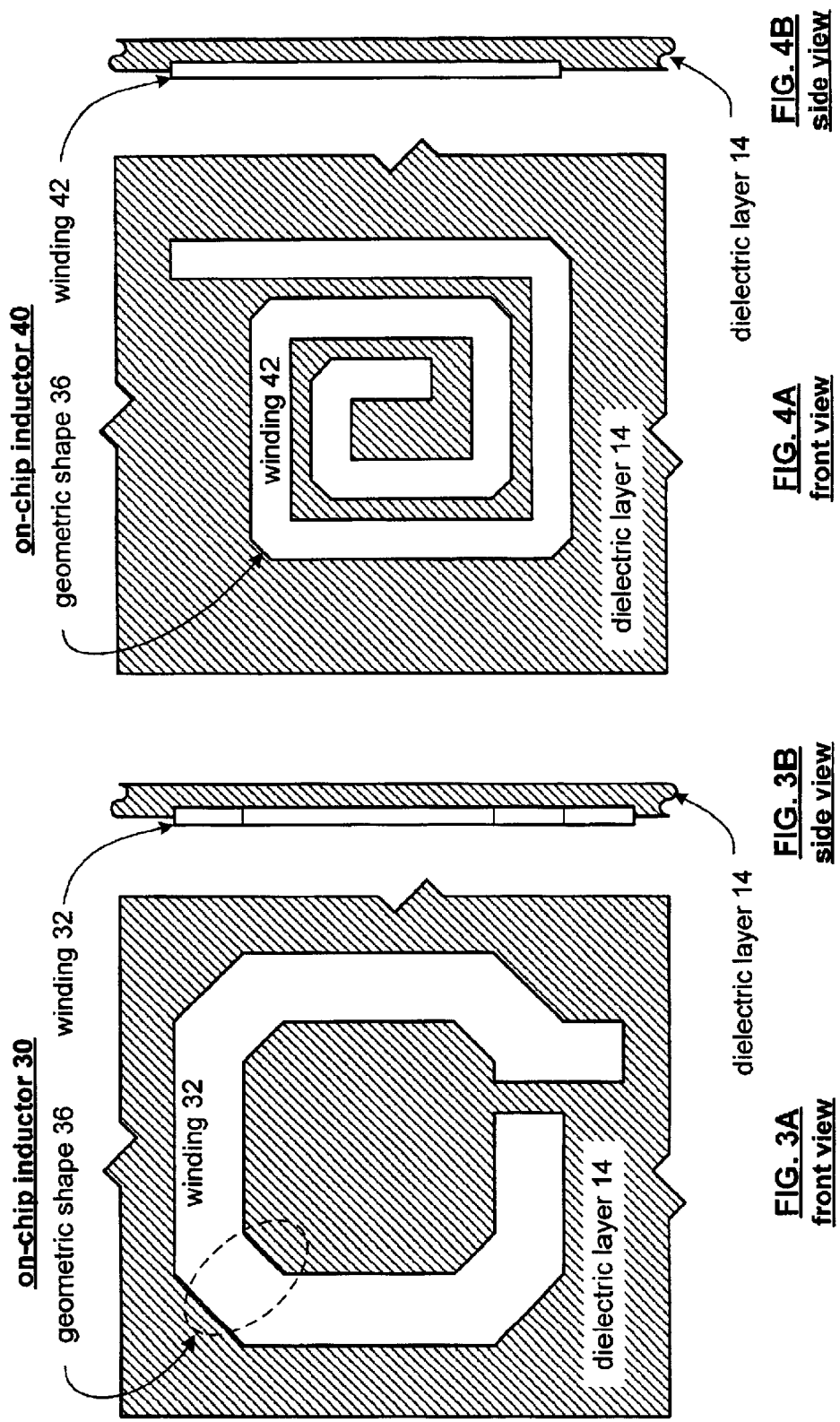

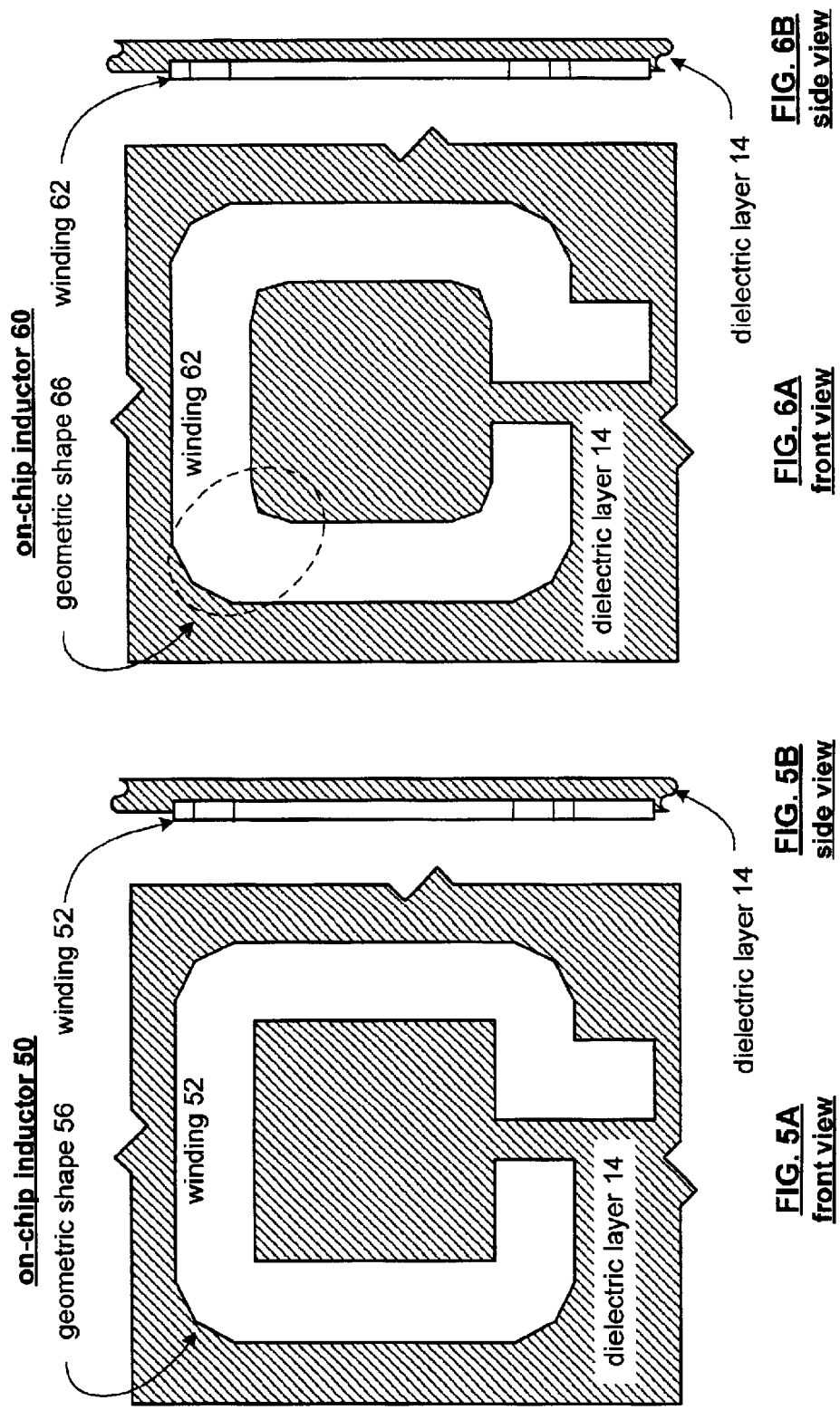

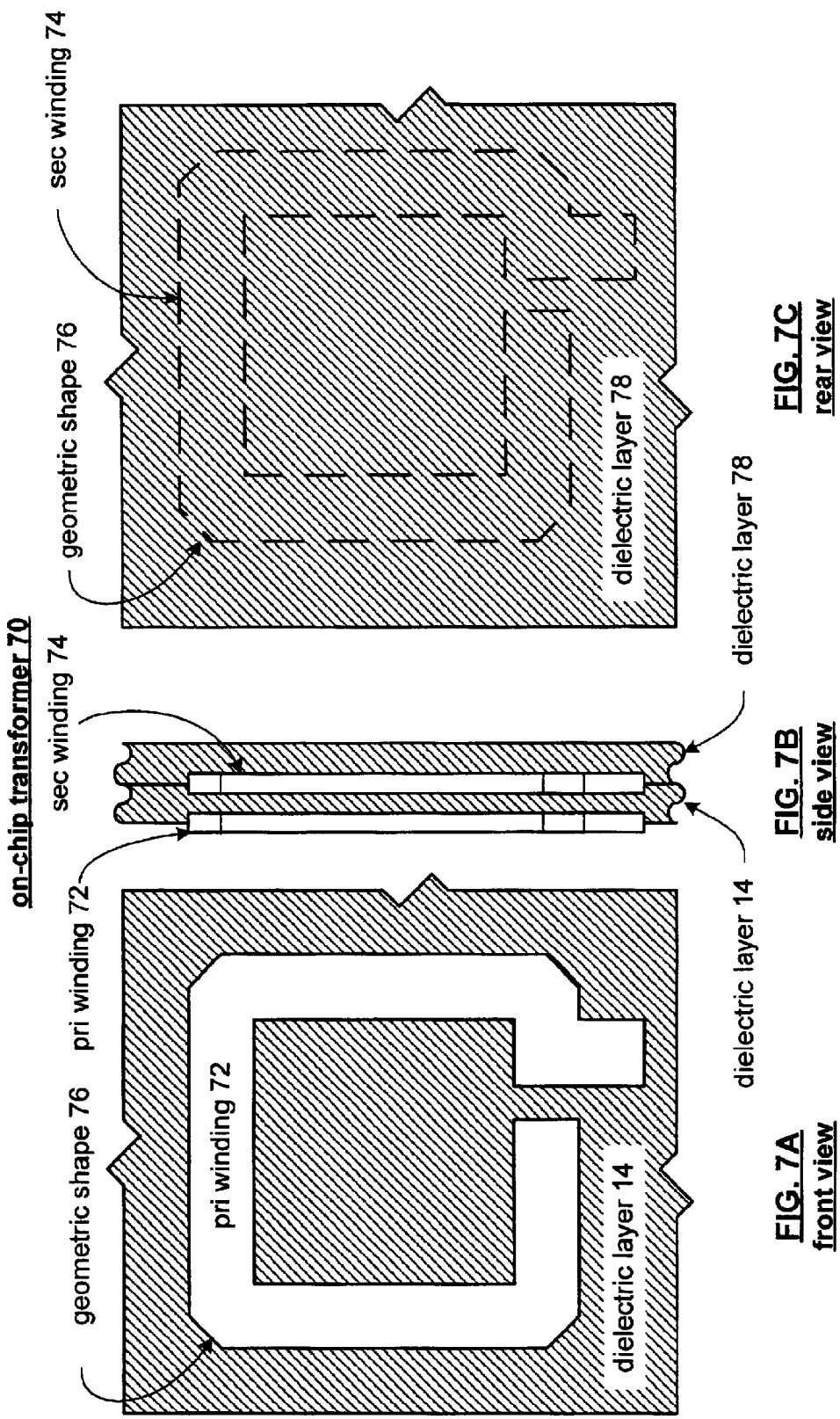

ON-CHIP INDUCTOR HAVING A SQUARE GEOMETRY AND HIGH Q FACTOR AND METHOD OF MANUFACTURE THEREOF

TECHNICAL FIELD OF THE INVENTION

This invention relates generally to integrated circuits and more particularly to on-chip inductors and on-chip transformers.

BACKGROUND OF THE INVENTION

Integrated circuits (IC's) are known to include a substrate, one or more dielectric layers on the substrate, and one or more metal layers supported by a corresponding dielectric layer. The metal layers are fabricated in such a way to produce on-chip components such as resistors, transistors, capacitors, inductors, et cetera. How an on-chip component is fabricated and the physical limits placed on on-chip components are dictated by the technology used and foundry rules governing such technology.

For example, CMOS technology is readily used for cost effective integrated circuits. Foundries that manufacture CMOS integrated circuits provide rules governing the number of dielectric layers, number of metal layers, metal track sizes, spacing between metal tracks, angular bends of metal tracks, and other aspects of integrated circuit production.

While CMOS technology and the corresponding foundry rules allow on-chip inductors to be created, the quality factor (i.e., the measure of a component's ability to produce a large output at a resident frequency and selectivity of the component) is limited to a value of 5–10. As is known, a circular trace pattern for an on-chip inductor theoretically has a greater Q factor than a square or rectangular trace pattern of similar inductance, but has a larger IC footprint and violates foundry rules. As such, circular on-chip inductors are not used.

To emulate the benefits of a circular on-chip inductor, while maintaining compliance with foundry rules, many integrated circuit designers use an octagonal inductor. However, an octagonal inductor is larger than a similar trace length square or rectangular inductor. As such, IC designers choose between larger octagonal inductors with a higher Q factor and smaller square or rectangular inductors with a lower Q factor. In some instances, an octagonal inductor is impractical due to its size and yet a square or rectangular on-chip inductor is impractical due to its low quality factor. And, in all instances, smaller on-chip inductors with similar performance characteristics are preferred over larger on-chip inductors.

Therefore, a need exists for a high quality factor rectangular and/or square on-chip inductor.

SUMMARY OF THE INVENTION

These needs and others are substantially met by the on-chip inductor and/or on-chip transformer disclosed herein. Such an on-chip inductor includes a dielectric layer and a conductive winding on the dielectric layer. The conductive winding has a substantially square geometry and has at least its exterior corners geometrically shaped to reduce impedance of the conductive winding at a particular operating frequency. Since the quality factor of an on-chip inductor is inversely proportional to the effective series impedance of the inductor at an operating frequency, by reducing the effective series impedance, the quality factor is increased. In addition, the inductor has lower capacitance values in comparison to substantially equal inductors that do not practice the present invention, thus allowing the inductor of the present invention to have a higher self-resonance.

Other embodiments of the on-chip inductor include providing a geometric shaping of the internal and external corners at approximately 135° each. Alternatively, the interior angle of a corner may be approximately 90° while the exterior of the corner may be approximately 135°. Further variations of the geometric shaping have multiple angles on the interior angle and multiple angles on the exterior angle. Still further embodiments of the on-chip inductor include having a spiral configuration for the conductive winding, having conductive windings on one or more dielectric layers operably coupled together via metal bridges, and/or including a secondary winding to produce an on-chip transformer.

Such an on-chip conductor and/or on-chip transformer may be manufactured by creating a dielectric layer and then creating a conductive winding on the dielectric layer. The conductive winding is created to have a substantially square geometry where its corners are geometrically shaped to reduce impedance of the on-chip inductor at an operating frequency.

BRIEF DESCRIPTION OF THE DRAWINGS

FIGS. 1A and 1B illustrate an on-chip inductor in accordance with the present invention;

FIGS. 2A and 2B illustrate an alternate embodiment of an on-chip inductor in accordance with the present invention;

FIGS. 3A and 3B illustrate another embodiment of an on-chip inductor in accordance with the present invention;

FIGS. 4A and 4B illustrate yet another embodiment of an on-chip inductor in accordance with the present invention;

FIGS. 5A and 5B illustrate a further embodiment of an on-chip inductor in accordance with the present invention;

FIGS. 6A and 6B illustrate yet a further embodiment of an on-chip inductor in accordance with the present invention;

FIGS. 7A, B and C illustrate an on-chip transformer in accordance with the present invention;

DETAIL DESCRIPTION OF A PREFERRED EMBODIMENT

Figure 9:
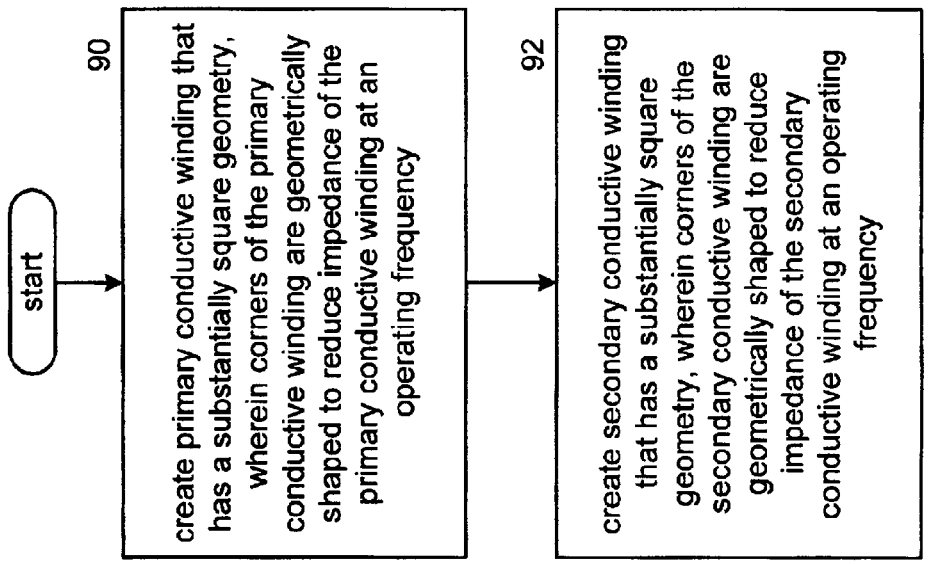
FIG. 9 illustrates a logic diagram of a method for manufacturing an on-chip transformer in accordance with the present invention.

FIGS. 1A and 1B illustrate an on-chip inductor 10 that includes a winding 12 on a dielectric layer 14. The winding 12 includes geometric shaping 16 at its exterior corners. As illustrated, winding 12 has a substantially square shape and may include one or more turns on one or more dielectric layers. By including the geometric shaping 16, the effective impedance at operating frequencies (e.g., 2.4 gigahertz) is reduced, thereby increasing the quality factor of on-chip inductor 10.

In general, the inductance value of an on-chip inductor is dependent on the length of the interior edge of the metalization (i.e., the interior edge of winding 12) where the current tends to concentrate. Accordingly, the interior diameter of the inductor is the deciding factor for size minimization. As has been demonstrated in simulations, the highest current density is distributed on the interior edge of an inductor and gives the dominate contribution to the inductance. Note that the simulations were performed at 1.6 gigahertz and 2.4 gigahertz. As such, the inductance of an on-chip inductor is increased by increasing the length of its interior edge. This favors a rectangular design rather than an octagonal one, occupying the same rectangular area on an integrated circuit and having the same track width.

To improve the quality factor of rectangular on-chip inductors and/or square on-chip inductors, current turbulence within the metal track needs to be reduced. Such turbulence consumes power as resistive loss, but does not contribute to the inductive value. Thus, by eliminating, or reducing current turbulence, by cutting the corners of winding 12, the resistive loss due to turbulence is reduced and the inductance value is not affected. As such, by including the 135° corners on the exterior of the winding, as illustrated in FIGS. 1A and 1B, the current turbulence is reduced, thus reducing resistive loss without effecting the inductance value. As is known, the quality factor for an inductor equals 2(pi)fL/R, where f is the operating frequency, L is the inductance, and R is the effective series resistance at the operating frequency. Thus, by maintaining the same inductance value and reducing the effective impedance at the operating frequency, the quality factor is increased. In simulations, the quality factor has been improved by at least 5% and in general is improved by at least 20%. As such, on-chip inductor 10 has the benefits over an octagonal inductor of similar inductance value in that it has a smaller integrated circuit footprint, can achieve similar inductance values and similar or greater quality factor values, and has lower capacitance values.

FIGS. 2A and 2B illustrate an on-chip inductor 20 that includes winding 22 formed on dielectric layer 14. Winding 22 includes geometric shape 26 at each of its corners. Winding 22 may be one or more turns on one or more dielectric layers to produce the on-chip inductor 20.

The geometric shape 26 has the interior and exterior angles of each corner being approximately 135°. As such, the geometric shaping 26 reduces the current turbulence within winding 22 and thus reduces the resistive loss without effecting the inductance value of on-chip inductor 20. As one of average skill in the art will appreciate, for the on-chip inductors of FIGS. 1 and 2, the geometric shaping 16 and 26 of 135° at the corners, is well within the current foundry rules for CMOS technology.

FIGS. 3A and 3B illustrate an on-chip inductor 30 that includes winding 32 created on dielectric layer 14. Winding 32 includes geometric shaping 36. In this embodiment, the geometric shaping 36 has angles on the interior and exterior corners of winding 32. The geometric shaping, more closely approximates an octagon but does not create an octagonal shape. In comparison with on-chip inductor 20, on-chip inductor 30 has more deeply cut corners at 135° angles.

FIGS. 4A and 4B illustrate an on-chip inductor 40 that includes winding 42 created on dielectric layer 14. Winding 42 includes a spiral configuration that may be on one or more dielectric layers. As shown, each corner of winding 42 is geometrically shaped 36. In this example, the geometric shaping is similar to the geometric shaping of FIG. 1 where the external corners have 135° angles while the interior angles are 90°. As one of average skill in the art will appreciate, the geometric shaping as illustrated in FIGS. 2A and 2B, and 3A and 3B may also be used with a spiral winding 42.

FIGS. 5A and 5B illustrate on-chip inductor 50 that includes winding 52 and dielectric layer 14. Winding 52 may be a single turn on a single dielectric layer, a spiral winding on a single dielectric layer, a single turn on multiple dielectric layers and/or multiple turns on multiple dielectric layers.

As illustrated, winding 52 includes geometric shaping 56 on its exterior angles. In this illustration, the geometric shaping 56 includes multiple angles at the corners. The angles for the geometric shaping 56 are dependent on allowable angle cuts per the foundry rules.

FIGS. 6A and 6B illustrate on-chip inductor 60 that includes winding 62 and dielectric layer 14. Winding 62 may be a single turn on dielectric layer 14, multiple turns on dielectric layer 14, multiple single turns on multiple dielectric layers or multiple turns on multiple dielectric layers.

As shown, each corner of winding 62 is geometrically shaped 66. In this illustration, the geometric shaping 66 includes multiple angles on both the interior corner and exterior corner of the corners of winding 62. Again, the angles for such multiple angles are dependent on allowable foundry rules.

FIGS. 7A, B and C illustrate an on-chip transformer 70 that includes a primary winding 72 on dielectric layer 14, a secondary winding 74 on dielectric layer 78. The primary winding 72 at each of its corners includes geometric shaping 76. The secondary winding 74 includes geometric shaping 76 at each of its corners. The geometric shaping 76 may include a single angular cut on each of its exterior corners (as shown in FIG. 1), singular angle cuts on each of its interior and exterior angles (as illustrated in FIG. 2 or 3), multiple cuts on its exterior corners (as illustrated in FIG. 5), or multiple angular cuts on its exterior and interior angles (as illustrated in FIG. 6).

As one of average skill in the art will appreciate, each of the primary and secondary windings may be a single turn on a single layer, multiple turns on a single layer, multiple single turns on multiple layers, and/or multiple spiral turns on multiple layers.

Figure 8:
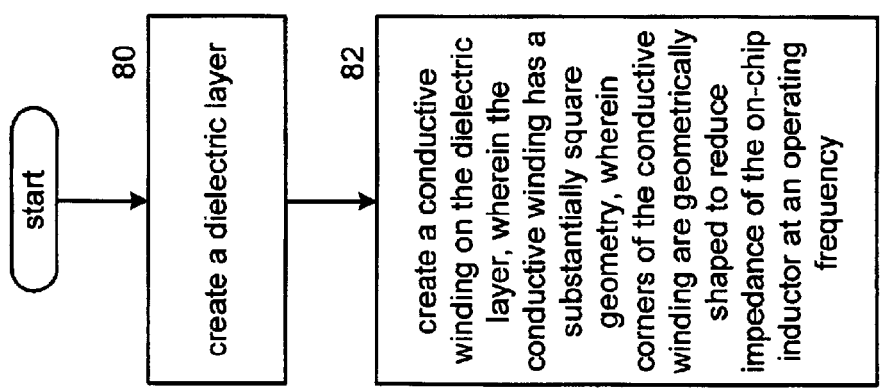
FIG. 8 illustrates a logic diagram of a method for manufacturing an on-chip inductor in accordance with the present invention.

FIG. 8 illustrates a logic diagram of a method for creating an on-chip inductor. The process begins at Step 80 where a dielectric layer is created on a substrate. The dielectric layer may be a silicon dielectric, gallium arsenate, silicon germanium, and/or any other material used to fabricate integrated circuits.

The process then proceeds to Step 82 where a conductive winding is created on the dielectric layer. The creation of the conductive winding includes forming the winding to have a substantially square geometry and geometrically shaping its corners to reduce impedance of the on-chip inductor at an operating frequency. The geometric shaping may be done as illustrated in FIGS. 1 through 3, 5, and 6. The fabrication of the conductive winding may be done as illustrated in FIGS. 1 through 6.

FIG. 9 illustrates a logic diagram of a method for creating an on-chip inductor. The process begins at Step 90 where a primary conductive winding that has a substantially square geometry is created on a 1$^{st}$ dielectric layer. The corners of the primary conductive winding are geometrically shaped to reduce impedance of the primary conductive winding at an operating frequency. The geometric shaping of the corners may be done as illustrated in FIGS. 1 through 3, 5, and 6.

The process then proceeds to Step 92 where a secondary conductive winding that has a substantially square geometry is created on a 2$^{nd}$ dielectric layer. The corners of the secondary conductive winding are geometrically shaped to reduce impedance of the secondary conductive winding at an operating frequency. The geometric shaping of the corners may be done as illustrated in FIGS. 1 through 3, 5 and 6. As one of average skill in the art will appreciate, the creation of the primary and secondary windings may be done by forming a single turn on a single dielectric layer, forming a single turn on multiple dielectric layers, forming multiple turns on a single dielectric layer or by forming multiple turns on multiple dielectric layers.

The preceding discussion has presented an on-chip inductor that has a substantially square geometry with an improved quality factor. As one of average skill in the art will appreciate, other embodiments may be derived from the teachings of the present invention, without deviating from the scope of the claims.

What is claimed is:

1. An on-chip inductor comprises:

dielectric layer; and conductive winding on the dielectric layer, wherein the conductive winding has a substantially square geometry, wherein corners of the conductive winding are geometrically shaped to reduce impedance of the on-chip inductor at an operating frequency with negligible effects on inductance of the on-chip inductor.

2. The on-chip inductor of claim 1, wherein the geometric shaping of the corners further comprises:

an interior angle per corner of approximately ninety degrees; and an exterior angle per corner of approximately one hundred thirty-five degrees.

3. The on-chip inductor of claim 1, wherein the geometric shaping of the corners further comprises:

an interior angle per corner of approximately one hundred thirty-five degrees; and an exterior angle per corner of approximately one hundred thirty-five degrees.

4. The on-chip inductor of claim 1, wherein the conductive winding further comprises:

a spiral configuration, wherein the corners of the spiral configuration are geometrically shaped to reduce impedance of the on-chip inductor at the operating frequency.

5. The on-chip inductor of claim 1, wherein the conductive winding further comprises:

a first winding on a first layer;

a second winding on a second layer; and at least one bridge connecting the first winding to the second winding.

6. The on-chip inductor of claim 1, wherein the geometric shaping of the corners further comprises:

angled exterior corners, wherein at least one angle per exterior corner reduces current turbulence in the corner at the operating frequency.

7. The on-chip inductor of claim 6, wherein the geometric shaping of the corners further comprises:

angled interior corners, wherein at least one angle per interior corner further reduces current turbulence in the corner at the operating frequency.

8. An on-chip transformer comprises:

primary conductive winding that has a substantially square geometry, wherein corners of the primary conductive winding are geometrically shaped to reduce impedance of the primary conductive winding at an operating frequency with negligible effects on inductance of the primary conductive winding; and secondary conductive winding that has a substantially square geometry, wherein corners of the secondary conductive winding are geometrically shaped to reduce impedance of the secondary conductive winding at an operating frequency, with negligible effects on inductance of the primary conductive winding, wherein the secondary conductive winding is magnetically coupled to the primary conductive winding.

9. The on-chip transformer of claim 8, wherein the geometric shaping of the corners further comprises:

an interior angle per corner of approximately ninety degrees; and an exterior angle per corner of approximately one hundred thirty-five degrees.

10. The on-chip transformer of claim 8, wherein the geometric shaping of the corners further comprises:

an interior angle per corner of approximately one hundred thirty-five degrees; and an exterior angle per corner of approximately one hundred thirty-five degrees.

11. The on-chip transformer of claim 8 further comprises:

dielectric layer;

the primary conductive winding on the dielectric layer, wherein the primary conductive winding includes a spiral configuration, wherein the corners of the spiral configuration are geometrically shaped to reduce impedance of the primary conductive winding at the operating frequency; and the secondary conductive winding on the dielectric layer, wherein the secondary conductive winding includes a secondary spiral configuration interwoven with the spiral configuration of the primary conductive winding, wherein the corners of the secondary spiral configuration are geometrically shaped to reduce impedance of the secondary conductive winding at the operating frequency.

12. The on-chip transformer of claim 8 further comprises:

first dielectric layer;

the primary conductive winding on the first dielectric layer, wherein the primary conductive winding includes a spiral configuration, wherein the corners of the spiral configuration are geometrically shaped to reduce impedance of the primary conductive winding at the operating frequency;

second dielectric layer juxtaposed to the primary conductive winding; and the secondary conductive winding on the secondary dielectric layer, wherein the secondary conductive winding includes the spiral configuration, wherein the corners of the spiral configuration are geometrically shaped to reduce impedance of the secondary conductive winding at the operating frequency.

13. The on-chip transformer of claim 8, wherein each of the primary and secondary conductive windings further comprises:

a first winding on a first layer;

a second winding on a second layer; and at least one bridge connecting the first winding to the second winding.

14. The on-chip transformer of claim 8, wherein the geometric shaping of the corners further comprises:

angled exterior corners, wherein at least one angle per exterior corner reduces current turbulence in the corner at the operating frequency.

15. The on-chip transformer of claim 14, wherein the geometric shaping of the corners further comprises:

angled interior corners, wherein at least one angle per interior corner further reduces current turbulence in the corner at the operating frequency.

* * * * *

UNITED STATES PATENT AND TRADEMARK OFFICE
CERTIFICATE OF CORRECTION

PATENT NO. : 6,937,128 B2  Page 1 of 1
APPLICATION NO. : 10/074158
DATED : August 30, 2005
INVENTOR(S) : Harry Contopanagos et al.

It is certified that error appears in the above-identified patent and that said Letters Patent is hereby corrected as shown below:

Column 6, line 2, in Claim 8: replace "frequency," with --frequency--

Signed and Sealed this

Sixteenth Day of December, 2008

JON W. DUDAS
*Director of the United States Patent and Trademark Office*